United States Patent
Onishi

(10) Patent No.: US 9,825,555 B2
(45) Date of Patent: Nov. 21, 2017

(54) SEMICONDUCTOR CONTROL DEVICE, SWITCHING DEVICE, INVERTER, AND CONTROL SYSTEM

(71) Applicant: TOYOTA JIDOSHA KABUSHIKI KAISHA, Toyota-shi, Aichi (JP)

(72) Inventor: Yukio Onishi, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 103 days.

(21) Appl. No.: 15/024,257

(22) PCT Filed: Sep. 17, 2014

(86) PCT No.: PCT/JP2014/074477
§ 371 (c)(1),
(2) Date: Mar. 23, 2016

(87) PCT Pub. No.: WO2015/053052
PCT Pub. Date: Apr. 16, 2015

(65) Prior Publication Data
US 2016/0233789 A1    Aug. 11, 2016

(30) Foreign Application Priority Data

Oct. 9, 2013   (JP) ................................. 2013-212167

(51) Int. Cl.
| | | |
|---|---|---|
| H02M 7/5387 | (2007.01) | |
| H03K 17/689 | (2006.01) | |
| H03K 17/082 | (2006.01) | |
| H03K 17/12 | (2006.01) | |
| H02J 7/02 | (2016.01) | |
| H03K 17/0812 | (2006.01) | |
| H02J 7/34 | (2006.01) | |

(52) U.S. Cl.
CPC ........... *H02M 7/5387* (2013.01); *H02J 7/022* (2013.01); *H03K 17/0828* (2013.01); *H03K 17/08128* (2013.01); *H03K 17/127* (2013.01); *H02J 7/345* (2013.01); *H03K 17/689* (2013.01); *H03K 2217/0027* (2013.01); *H03K 2217/0036* (2013.01)

(58) Field of Classification Search
CPC ........ A47L 9/00; A47L 9/2831; A47L 9/2847; A47L 9/2857; A47L 9/2889; H02H 7/00; H02H 7/06; H02J 7/00; H02J 7/022; H02J 7/345; H02M 7/00; H02M 7/5387; H03K 17/00; H03K 17/08128; H03K 17/0828; H03K 17/127; H03K 17/689; H03K 2217/00; H03K 2217/0027; H03K 2217/0036
USPC .......................................................... 307/22
See application file for complete search history.

(56) References Cited

FOREIGN PATENT DOCUMENTS

JP         2012-186899 A       9/2012

*Primary Examiner* — Lincoln Donovan
*Assistant Examiner* — David Mattison
(74) *Attorney, Agent, or Firm* — Oliff PLC

(57) ABSTRACT

A semiconductor control device includes a switching element including a main element, and a sense element connected in parallel with the main element; and a control circuit configured to bias a sense electrode of the sense element by a negative voltage, and to detect a leakage current of another switching element connected in series with the main element. The control circuit biases the sense electrode by the negative voltage, for example, so as to turn on the sense element, without turning on the main element.

15 Claims, 6 Drawing Sheets

US 9,825,555 B2

SEMICONDUCTOR CONTROL DEVICE, SWITCHING DEVICE, INVERTER, AND CONTROL SYSTEM

TECHNICAL FIELD

The disclosures herein generally relate to a semiconductor control device that includes a switching element having a main element and a sense element, a switching device, an inverter, and a control system.

BACKGROUND ART

As a semiconductor control device that includes a switching element having a main element and a sense element, for example, a power module has been known as disclosed in Patent Document 1. This power module detects an overcurrent flowing in the main element, by detecting a sense current flowing in the sense element.

RELATED-ART DOCUMENTS

Patent Documents

[Patent Document 1] Japanese Laid-open Patent Publication No. 2012-186899

SUMMARY OF THE INVENTION

Problem to be Solved by Invention

However, the area ratio of the sense element with respect to the main element is very small (for example, for a certain IGBT, the emitter area ratio of the sense element with respect to the main element is less than or equal to 1/1,000). Therefore, even if attempting to detect a very weak leakage current in another switching element connected in series with the main element, by the sense element, the very weak leakage current mostly flows in the main element, and only an extremely weak sense current flows in the sense element. Therefore, for the conventional technology that is to detect a comparatively great sense current to detect an overcurrent, detecting the extremely weak sense current is difficult by itself, and it is also difficult to detect the very weak leakage current in the other switching element connected in series with the main element.

Thereupon, it is an object to provide a semiconductor control device, a switching device, an inverter, and a control system that can detect a leakage current in the other switching element connected in series with the main element.

Means to Solve the Problem

To achieve the object, a semiconductor control device, a switching device, an inverter, and a control system are provided that include a switching element including a main element, and a sense element connected in parallel with the main element; and a control circuit configured to bias a sense electrode of the sense element by a negative voltage, and to detect a leakage current of another switching element connected in series with the main element.

Advantage of the Invention

According to an embodiment, it is possible to detect a leakage current in the other switching element connected in series with the main element.

MODE FOR CARRYING OUT THE INVENTION

In the following, embodiments will be described with reference to the drawings.

<Configuration of Switching Circuit 1>

Figure 1:
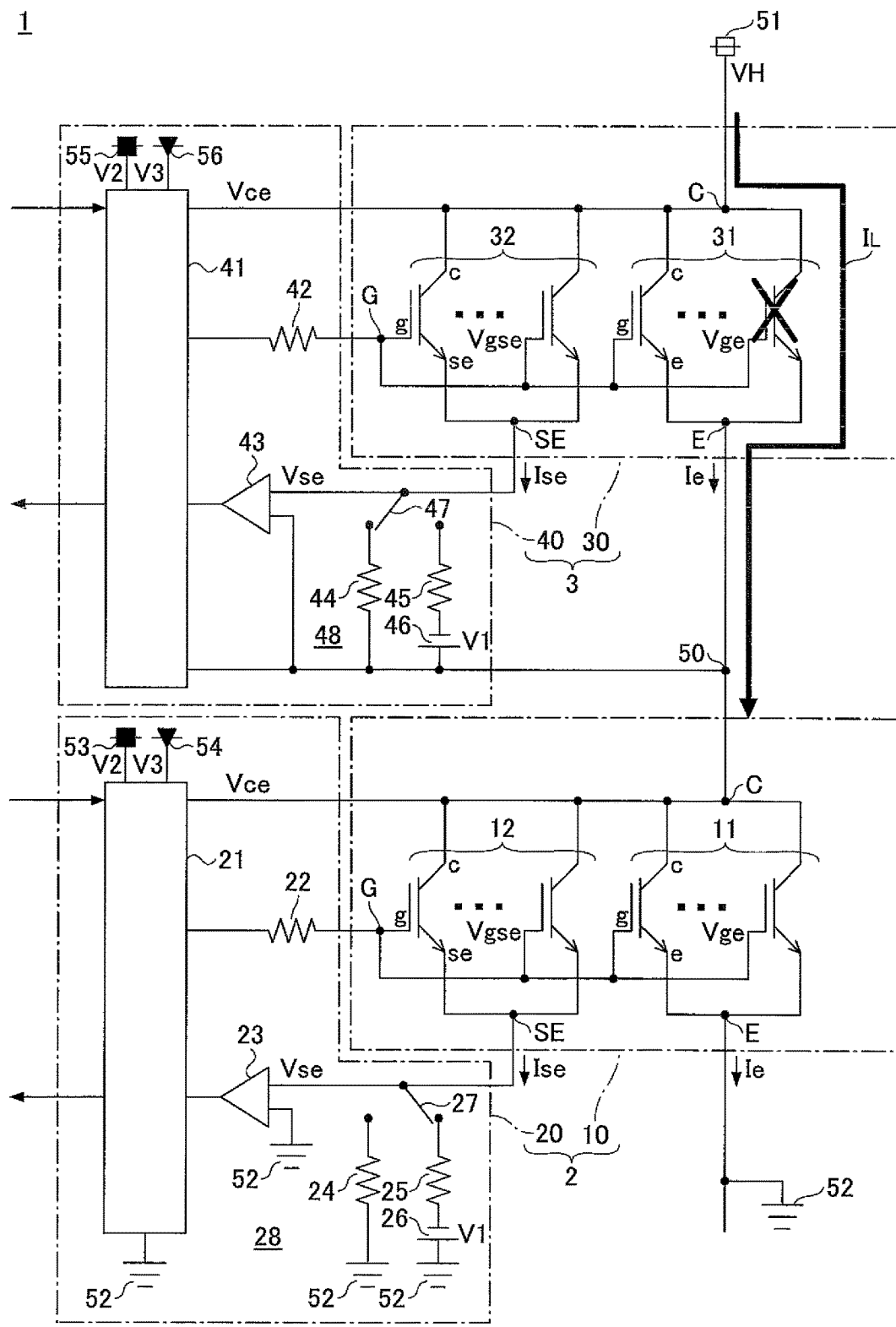
FIG. 1 is a configuration diagram that illustrates an example of a switching device including semiconductor control devices on a high side and a low side.

FIG. 1 is a diagram that illustrates an example configuration of a switching circuit 1, as an example of a switching device including a semiconductor control device 2 on the low side, and a semiconductor control device 3 on the high side. The switching circuit 1 may be a semiconductor device that is constituted with an integrated circuit, or a semiconductor device that is constituted with discrete parts. Also, the switching circuit 1 may be an electronic control unit (a so-called "ECU") that has such a semiconductor device installed in a housing.

The switching circuit 1 is a semiconductor circuit that includes a unit to drive an inductive load (for example, a motor or a reactor) connected with an intermediate node part 50, by driving on and off switching elements 10 and 30.

The switching circuit 1 is an example of a switching device that includes the semiconductor control device 2 on the low side closer to a low power source potential part 52 with respect to the intermediate node part 50, and the semiconductor control device 3 on the high side closer to a high power source potential part 51 with respect to the intermediate node part 50.

The low power source potential part 52 is a conductive part that has a lower potential than the intermediate node part 50, for example, a ground potential part that is conductively connected with the negative electrode of a power source, a grounding part of a vehicle body, or the like. The high power source potential part 51 is a conductive part that has a higher potential than the intermediate node part 50, for example, a power source potential part that is conductively connected with the positive electrode of the power source or the like.

The semiconductor control device 2 is a semiconductor circuit that includes the switching element 10 and a control circuit 20, and drives the switching element 10 on the low side, by a drive circuit 21 of the control circuit 20. The semiconductor control device 3 is a semiconductor circuit that includes the switching element 30 and a control circuit 40, and drives the switching element 30 on the high side, by a drive circuit 41 of the control circuit 40.

The switching element 10 may be a semiconductor element on the same substrate as the control circuit 20, or may be a semiconductor element on a substrate different from that for the control circuit 20. The switching element 30 may be a semiconductor element on the same substrate as the control circuit 40, or may be a semiconductor element on a substrate different from that for the control circuit 40. The switching element 10 may be a semiconductor element on the same substrate as the switching element 30, or may be a semiconductor element on a substrate different from that for the switching element 30.

The switching elements 10 and 30 are insulated-gate, voltage-controlled semiconductor elements having a current sense function. The switching element 10 is a low side arm that turns on and off following a gate voltage controlled by the drive circuit 21, and the switching element 30 is a high side arm that turns on and off following a gate voltage controlled by the drive circuit 41. The switching element 10 and the switching element 30 are disposed in series, and face the high side and the low side, respectively.

As specific examples of the switching elements 10 and 30, power transistor elements such as IGBTs and MOSFETs may be considered. FIG. 1 illustrates IGBTs as examples of the switching elements 10 and 30. In the following, the switching elements 10 and 30 are assumed to be IGBTs for the description. If they are MOSFETs, the wording may be changed to read a "collector" as a "drain", and an "emitter" as a "source".

A gate terminal G of the switching element 10 is a control terminal connected with, for example, the drive circuit 21 of the control circuit 20 via a gate resistor 22 connected in series with the gate terminal G. A collector terminal C of the switching element 10 is a first main terminal connected with, for example, the high power source potential part 51 via the intermediate node part 50 and the switching element 30. An emitter terminal E of the switching element 10 is a second main terminal connected with, for example, the low power source potential part 52. A sense emitter terminal SE of the switching element 10 is a sense terminal connected with, for example, the low power source potential part 52, commonly with the emitter terminal E of the switching element 10, via a sense resistor 24 or a sense resistor 25 for current detection.

A gate terminal G of the switching element 30 is a control terminal connected with, for example, the drive circuit 41 of the control circuit 40 via a gate resistor 42 connected in series with the gate terminal G. A collector terminal C of the switching element 30 is a first main terminal connected with, for example, the high power source potential part 51. An emitter terminal E of the switching element 30 is a second main terminal connected with, for example, the low power source potential part 52 via the intermediate node part 50 and the switching element 10. A sense emitter terminal SE of the switching element 30 is a sense terminal connected with, for example, the intermediate node part 50, commonly with the emitter terminal E of the switching element 30, via a sense resistor 44 or a sense resistor 45 for current detection.

The switching element 10 is configured to include a main element 11 and a sense element 12. The main element 11 and the sense element 12 are switching elements constituted with IGBTs. The sense element 12 is connected in parallel with the main element 11. The main element 11 and the sense element 12 may be constituted with multiple cell transistors, respectively.

The gate electrodes g of the main element 11 and the sense element 12 are control electrodes, respectively, commonly connected with the gate terminal G of the switching element 10. The collector electrodes c of the main element 11 and the sense element 12 are first main electrodes, respectively, commonly connected with the collector terminal C of the switching element 10. The emitter electrode e of the main element 11 is a second main electrode connected with the emitter terminal E of the switching element 10. The sense emitter electrode se of the sense element 12 is a sense electrode connected with the sense emitter terminal SE of the switching element 10.

The collector electrodes c of the main element 11 and the sense element 12 are connected with the intermediate node part 50, and are connected in series with the emitter electrode e of the main element 31 of the switching element 30, via the intermediate node part 50 and the emitter terminal E of the switching element 30.

A collector current that flows into the switching element 10 from the collector terminal C is divided into a principal current Ie flowing in the main element 11, and a sense current Ise flowing in the sense element 12, by a sense ratio n. The sense current Ise is a current that flows depending on the principal current Ie by the sense ratio n, and its current value is made smaller than the principal current Ie by the sense ratio n. The sense ratio n is determined, for example, depending on a ratio of the area of the emitter electrode e of the main element 11, and the area of the sense emitter electrode se of the sense element 12.

The principal current Ie flows through the collector electrode c and the emitter electrode e in the main element 11, and is output from the emitter terminal E. The principal current Ie output from the emitter terminal E flows in the low power source potential part 52. The sense current Ise flows through the collector electrode c and the sense emitter electrode se in the sense transistor 13, and is output from the sense emitter terminal SE. The sense current Ise output from the sense emitter terminal SE flows in the low power source potential part 52 via one of the sense resistor 24 and the sense resistor 25.

The switching element 30 is configured to include the main element 31 and a sense element 32. The main element 31 and the sense element 32 are switching elements constituted with IGBTs. The sense element 32 is connected in parallel with the main element 31. The main element 31 and the sense element 32 may be constituted with multiple cell transistors, respectively.

The gate electrodes g of the main element 31 and the sense element 32 are control electrodes, respectively, commonly connected with the gate terminal G of the switching element 30. The collector electrodes c of the main element 31 and the sense element 32 are first main electrodes, respectively, commonly connected with the collector terminal C of the switching element 30. The emitter electrode e of the main element 31 is a second main electrode connected with the emitter terminal E of the switching element 30. The sense emitter electrode se of the sense element 32 is a sense electrode connected with the sense emitter terminal SE of the switching element 30.

The emitter electrode e of the main element 31 is connected with the intermediate node part 50, and is connected in series with the collector electrodes c of the main element 11 and the sense element 12 of the switching element 10, via the intermediate node part 50 and the collector electrode C of the switching element 10.

A collector current that flows into the switching element 30 from the collector terminal C is divided into a principal current Ie flowing in the main element 31, and a sense current Ise flowing in the sense element 32, by a sense ratio n. The sense current Ise is a current that flows depending on the principal current Ie by the sense ratio n, and its current value is made smaller than the principal current Ie by the sense ratio n. The sense ratio n is determined, for example, depending on a ratio of the area of the emitter electrode e of the main element 31, and the area of the sense emitter electrode se of the sense element 32.

The principal current Ie flows through the collector electrode c and the emitter electrode e in the main element 31, and is output from the emitter terminal E. The principal current Ie output from the emitter terminal E flows in the intermediate node part 50. The sense current Ise flows through the collector electrode c and the sense emitter electrode se in the sense element 32, and is output from the sense emitter terminal SE. The sense current Ise output from the sense emitter terminal SE flows in the intermediate node part 50 via one of the sense resistor 44 and the sense resistor 45.

The control circuit 20 includes the drive circuit 21 that is connected with the gate terminal G of the switching element 10 via the gate resistor 22. Note that a gate resistor may be inserted between the gate terminal G and the gate electrode g of the main element 11, or between the gate terminal G and the gate electrode g of the sense element 12.

The drive circuit 21 is a drive unit to control a gate potential Vg at the gate terminal G of the switching element 10 via the gate resistor 22, to take a potential to turn on or off the switching element 10, following a gate control signal supplied from the outside. By controlling the gate potential Vg, the drive circuit 21 controls a gate voltage Vge of the main element 11 to take a voltage value to turn on or off the main element 11, and controls a gate voltage Vgse of the sense element 12 to take a voltage value to turn on or off the sense element 12. The gate voltage Vge is a control voltage applied to the main element 11 between the gate electrode g and the emitter electrode e, and the gate voltage Vgse is a control voltage applied to the sense element 12 between the gate electrode g and the sense emitter electrode se.

The control circuit 40 includes the drive circuit 41 that is connected with the gate terminal G of the switching element 30 via the gate resistor 42. Note that a gate resistor may be inserted between the gate terminal G and the gate electrode g of the main element 31, or between the gate terminal G and the gate electrode g of the sense element 32.

The drive circuit 41 is a drive unit to control a gate potential Vg at the gate terminal G of the switching element 30 via the gate resistor 42, to take a potential to turn on or off the switching element 30, following a gate control signal supplied from the outside. By controlling the gate potential Vg, the drive circuit 41 controls a gate voltage Vge of the main element 31 to take a voltage value to turn on or off the main element 31, and controls a gate voltage Vgse of the sense element 32 to take a voltage value to turn on or off the sense element 32. The gate voltage Vge is a control voltage applied to the main element 31 between the gate electrode g and the emitter electrode e, and the gate voltage Vgse is a control voltage applied to the sense element 32 between the gate electrode g and the sense emitter electrode se.

Each of the drive circuits 21 and 41 is an integrated circuit to control the gate potential Vg, following the gate control signal supplied from a predetermined control unit (for example, a system control unit 126 in FIG. 4, which will be described later) that includes a microcomputer, for example, having a CPU and the like. Note that the drive circuits 21 and 41 themselves may be a microcomputer(s).

The control circuit 20 includes a sense current detection circuit 28 that is connected with the sense emitter terminal SE of the switching element 10.

The sense current detection circuit 28 is a sense current detection part that detects the sense current Ise of the sense element 12, and outputs a sense current detection signal depending on the magnitude of the sense current Ise of the sense element 12. The sense current detection circuit 28 includes, for example, the sense resistor 24, the sense resistor 25, a bias power source 26, a switch 27, and a sense voltage detection part 23.

The sense resistor 24 is a shunt resistor for detecting an overcurrent that flows between the collector electrode c and the emitter electrode e in the main element 11. The sense resistor 24 has, for example, one terminal that is connected with the sense emitter terminal SE via the switch 27, and the other terminal that is connected with the low power source potential part 52.

The sense resistor 25 is a shunt resistor for detecting a leakage current IL that flows in the other switching element 30 (especially, in the main element 31) connected in series with the main element 11 of the switching element 10. The sense resistor 25 has, for example, one terminal that is connected with the sense emitter terminal SE via the switch 27, and the other terminal that is connected with the low power source potential part 52 via the bias power source 26.

The bias power source 26 is a circuit that can bias the sense emitter electrode se of the sense element 12 by a negative voltage V1, via the sense resistor 25 and the switch 27. The negative voltage V1 is a bias voltage to make the potential of the sense emitter electrode se of the sense element 12 be lower than the potential of the emitter electrode e of the main element 11, when the sense emitter electrode se of the sense element 12 is to be biased.

The switch 27 is an example of a switching circuit to switch the connection destination of the sense emitter electrode se of the sense element 12 to the sense resistor 24 or the sense resistor 25, depending on whether to measure the leakage current IL that flows in the switching element 30. The switch 27 switches between a state where the connection destination of the sense emitter electrode se is switched to the sense resistor 24 via the sense emitter terminal SE, and a state where the connection destination of the sense emitter electrode se is switched to the sense resistor 25 via the sense emitter terminal SE.

In a normal use state turning the switching element 10 on and off following the gate voltage (in a case where the leakage current IL is not measured that flows in the switching element 30), the switch 27 switches the connection destination of the sense emitter electrode se of the sense element 12, to the sense resistor 24. This makes it possible to detect an overcurrent that flows in the main element 11. On the other hand, in a case where the leakage current IL is to be measured that flows in the switching element 30, based on the sense current Ise that flows in the sense element 12, the switch 27 switches the connection destination of the sense emitter electrode se of the sense element 12, to the sense resistor 25. This makes it possible to detect the leakage current IL that flows in the switching element 30.

The switch 27 switches the connection destination of the sense emitter electrode se of the sense element 12 to one of the sense resistor 24 and the sense resistor 25, for example, following a switching control signal that determines whether to measure the leakage current IL that flows in the switching element 30. Such a switching control signal may be commanded by, for example, the predetermined control unit (for example, the system control unit 126 in FIG. 4 as will be described later) or the drive circuit 21.

The sense voltage detection part 23 is a circuit to detect whether a sense voltage Vse is greater than or equal to a predetermined voltage value, which is generated when the sense current Ise flows in one of the sense resistor 24 and the sense resistor 25 from the sense emitter terminal SE. If detecting that the sense voltage Vse is greater than or equal to the predetermined voltage value, the sense voltage detection part 23 outputs a sense current detection signal (for example, a high-level signal). The sense voltage detection part 23 may be constituted with, for example, a comparator, or may be constituted with an operational amplifier.

In a state where the connection destination of the sense emitter electrode se of the sense element 12 is switched to the sense resistor 24 by the switch 27, if a sense current detection signal is detected, the drive circuit 21 determines that the current that flows in the main element 11 is an overcurrent. If determining that the current that flows in the main element 11 is an overcurrent, the drive circuit 21 controls the gate voltage Vge of the main element 11 and the gate voltage Vgse of the sense element 12, for example, to a voltage value to turn off the main element 11 and the sense element 12. This can prevent the overcurrent from continuously flowing in the main element 11 and the sense element 12.

On the other hand, in a state where the connection destination of the sense emitter electrode se of the sense element 12 is switched to the sense resistor 25 by the switch 27, if a sense current detection signal is detected, the drive circuit 21 determines that a leakage current IL greater than or equal to a predetermined current value flows in the main element 31 of the switching element 30. If determining that a leakage current IL greater than or equal to the predetermined current value flows in the main element 31, the drive circuit 21 outputs a leakage detection signal to indicate to the predetermined control unit (for example, the system control unit 126 in FIG. 4 as will be described later) that the leakage current IL greater than or equal to the predetermined current value has been detected. If detecting a leakage detection signal about the switching element 30, for example, the predetermined control unit stores information about generation of the leakage current of the switching element 30, in a memory, and indicates the information to a user. This makes it possible to easily identify a switching element in which a leakage current is detected, among the multiple switching elements.

The bias power source 26 is a circuit that biases the sense emitter electrode se of the sense element 12 connected with the sense resistor 25 via the switch 27, by the negative voltage V1, to turn on the sense element 12 when measuring the leakage current IL of the switching element 30. By biasing the sense emitter electrode se of the sense element 12 by the negative voltage V1, the gate voltage Vgse of the sense element 12 becomes greater. Therefore, a part of the leakage current IL that flows in the sense element 12 increases, and hence, the current value of the sense current Ise that flows in the sense element 12 can be increased. By having the current value of the sense current Ise increased, the sense voltage Vse generated by the sense resistor 25 also increases. Therefore, the sense voltage detection part 23 can easily detect the sense voltage Vse even if the current value of the leakage current IL is extremely small, and can easily detect the very weak leakage current IL.

The bias power source 26 biases the sense emitter electrode se of the sense element 12 by the negative voltage V1 to turn on the sense element 12, for example, so that the gate voltage Vgse of the sense element 12 becomes higher than the gate voltage Vge of the main element 11. This makes a greater current flow in the sense element 12 than in the main element 11, and hence, the current value of the sense current Ise can be increased. Therefore, the sense voltage detection part 23 can easily detect the sense voltage Vse even if the current value of the leakage current IL is extremely small, and can easily detect the very weak leakage current IL.

Also, the bias power source 26 biases the sense emitter electrode se of the sense element 12 by the negative voltage V1 to turn on the sense element 12, for example, so that only the sense element 12 turns on without turning on the main element 11. This makes the entire leakage current IL of the switching element 30 flows in the sense element 12 without flowing in the main element 11, and hence, the current value of the sense current Ise can be increased to be virtually equivalent to the current value of the leakage current IL. Therefore, the sense voltage detection part 23 can easily detect the sense voltage Vse even if the current value of the leakage current IL is extremely small, and can easily detect the very weak leakage current IL.

When biasing the sense emitter electrode se of the sense element 12 by the negative voltage V1 to turn on the sense element 12, for example, the drive circuit 21 lowers a voltage to bias both the gate electrodes g of the main element 11 and the sense element 12, from a power supply voltage V2 to a power supply voltage V3. For example, the power supply voltage V2 is an output voltage of a gate-driving power source 53 that is selected when not measuring the leakage current IL, and the power supply voltage V3 is an output voltage of a gate-driving power source 54 that is selected when measuring the leakage current IL.

When the drive circuit 21 lowers the voltage to bias the gate electrodes g, the voltage value of the negative voltage V1, and the power supply voltages V2 and V3 may be set so that the gate voltage Vgse of the sense element 12 becomes higher than the gate voltage Vge of the main element 11. Alternatively, when the drive circuit 21 lowers the voltage to bias the gate electrodes g, the voltage value of the negative voltage V1, and the power supply voltages V2 and V3 may be set so that a greater current flow in the sense element 12 than in the main element 11. Alternatively, when the drive circuit 21 lowers the voltage to bias the gate electrodes g, the voltage value of the negative voltage V1, and the power supply voltages V2 and V3 may be set so that only the sense element 12 turns on without turning on the main element 11.

For example, if the threshold voltage Vth of the main element 11 and the sense element 12 is 10 V in the switching element 10, the negative voltage V1 is set to −3 V, the power supply voltage V2 is set to 15 V, and the power supply voltage V3 is set to 7 V. By setting in this way, for example, when not measuring the leakage current IL where the power supply voltage V2 is selected, without biasing by the negative voltage V1, it is possible to turn on and off the main element 11 and the sense element 12, following on and off of the power supply voltage V2. On the other hand, when measuring the leakage current IL where the power supply voltage V3 is selected, with biasing by the negative voltage V1, the gate voltage Vge of the main element 11 is less than the threshold voltage Vth, and the gate voltage Vgse of the sense element 12 is greater than or equal to the threshold voltage Vth. Therefore, only the sense element 12 can be turned on without turning on the main element 11.

Note that, for example, when a leakage current IL of 1 mA flows in the sense element 12, without flowing in the main element 11, if the resistance value of the sense resistor 25 is set to 1 kΩ, the voltage drop at the sense resistor 25 is about 1 V (=1 mA×1 kΩ). In this way, a current flowing in the sense resistor 25 makes the gate voltage Vgse of the sense element 12 drop by the voltage drop. Therefore, the voltage values of the negative voltage V1 and the power supply voltages V2 and V3 may be set so that the gate voltage Vgse of the sense element 12 is over the threshold voltage Vth of the sense element 12 even if a voltage drop is generated as above.

Also, since a leakage current is extremely smaller than an overcurrent, if the sense resistor 25 used for detecting a leakage current has a resistance value greater than the sense resistor 24 used for detecting an overcurrent, a leakage current can be easily detected as an overcurrent. For example, when an overcurrent of 500 A is divided to flow in the main element 11 and the sense element 12 by a ratio of 1000 to 1, if the resistance value of the sense resistor 24 is set to 2Ω, the voltage drop at the sense resistor 24 is about 1 V (=0.5 A×2Ω), which is the same as in the above case of the sense resistor 25.

On the other hand, the control circuit 40 includes a sense current detection circuit 48 that is connected with the sense emitter terminal SE of the switching element 30. The sense current detection circuit 48 and the drive circuit 41 on the high side have the same configurations and functions as the sense current detection circuit 28 and the drive circuit 21 on the low side, and hence, the description will be simplified below.

The sense current detection circuit 48 is a sense current detection part that detects the sense current Ise of the sense element 32, and outputs a sense current detection signal depending on the magnitude of the sense current Ise of the sense element 32. The sense current detection circuit 48 includes, for example, the sense resistor 44, the sense resistor 45, a bias power source 46, a switch 47, and a sense voltage detection part 43.

The sense resistor 44 is a shunt resistor for detecting an overcurrent that flows between the collector electrode c and the emitter electrode e in the main element 31. The sense resistor 44 has, for example, one terminal that is connected with the sense emitter terminal SE via the switch 47, and the other terminal that is connected with the intermediate node part 50.

The sense resistor 45 is a shunt resistor for detecting a leakage current IL that flows in the other switching element 10 (especially, in the main element 11) connected in series with the main element 31 of the switching element 30. The sense resistor 45 has, for example, one terminal that is connected with the sense emitter terminal SE via the switch 47, and the other terminal that is connected with the intermediate node part 50 via the bias power source 46.

The bias power source 46 is a circuit that can bias the sense emitter electrode se of the sense element 32 by the negative voltage V1, via the sense resistor 45 and the switch 47. The negative voltage V1 is a bias voltage to make the potential of the sense emitter electrode se of the sense element 32 be lower than the potential of the emitter electrode e of the main element 31, when biasing the sense emitter electrode se of the sense element 32.

The switch 47 is an example of a switching circuit to switch the connection destination of the sense emitter electrode se of the sense element 32 to the sense resistor 24 or the sense resistor 25, depending on whether to measure the leakage current IL that flows in the switching element 30. The switch 47 switches between a state where the connection destination of the sense emitter electrode se is switched to the sense resistor 44 via the sense emitter terminal SE, and a state where the connection destination of the sense emitter electrode se is switched to the sense resistor 45 via the sense emitter terminal SE.

In a normal use state turning the switching element 30 on and off following the gate voltage (in a case where the leakage current IL is not measured that flows in the switching element 10), the switch 47 switches the connection destination of the sense emitter electrode se of the sense element 32, to the sense resistor 44. This makes it possible to detect an overcurrent that flows in the main element 31. On the other hand, in a case where the leakage current IL is to be measured that flows in the switching element 10, based on the sense current Ise that flows in the sense element 32, the switch 47 switches the connection destination of the sense emitter electrode se of the sense element 32, to the sense resistor 45. This makes it possible to detect a leakage current IL that flows in the switching element 10.

The switch 47 switches the connection destination of the sense emitter electrode se of the sense element 32 to one of the sense resistor 44 and the sense resistor 45, for example, following a switching control signal that determines whether to measure the leakage current IL that flows in the switching element 10. Such a switching control signal may be commanded by, for example, the predetermined control unit (for example, the system control unit 126 in FIG. 4 as will be described later) or the drive circuit 41.

The sense voltage detection part 43 is a circuit to detect whether a sense voltage Vse is greater than or equal to a predetermined voltage value, which is generated when the sense current Ise flows in one of the sense resistor 44 and the sense resistor 45 from the sense emitter terminal SE. If detecting that the sense voltage Vse is greater than or equal to the predetermined voltage value, the sense voltage detection part 43 outputs a sense current detection signal (for example, a high-level signal). The sense voltage detection part 43 may be constituted with, for example, a comparator, or may be constituted with an operational amplifier.

In a state where the connection destination of the sense emitter electrode se of the sense element 32 is switched to the sense resistor 44 by the switch 47, if a sense current detection signal is detected, the drive circuit 41 determines that the current that flows in the main element 31 is an overcurrent. If determining that the current that flows in the main element 31 is an overcurrent, the drive circuit 41 controls the gate voltage Vge of the main element 31 and the gate voltage Vgse of the sense element 32, for example, to a voltage value to turn off the main element 31 and the sense element 32. This can prevent the overcurrent from continuously flowing in the main element 31 and the sense element 32.

On the other hand, in a state where the connection destination of the sense emitter electrode se of the sense element 32 is switched to the sense resistor 45 by the switch 47, if a sense current detection signal is detected, the drive circuit 41 determines that a leakage current IL greater than or equal to the predetermined current value flows in the main element 11 of the switching element 10. If determining that a leakage current IL greater than or equal to the predetermined current value flows in the main element 11, the drive circuit 41 outputs a leakage detection signal to indicate to the predetermined control unit (for example, the system control unit 126 in FIG. 4 as will be described later) that the leakage current IL greater than or equal to the predetermined current value has been detected. If detecting a leakage detection signal about the switching element 30, for example, the predetermined control unit stores information about generation of the leakage current of the switching element 10, in a memory, and indicates the information to the user. This makes it possible to easily identify a switching element in which a leakage current is detected, among the multiple switching elements.

The bias power source 46 is a circuit that biases the sense emitter electrode se of the sense element 32 connected with the sense resistor 45 via the switch 47, by the negative voltage V1, to turn on the sense element 32 when measuring the leakage current IL of the switching element 10. By biasing the sense emitter electrode se of the sense element 32 by the negative voltage V1, the gate voltage Vgse of the sense element 32 becomes greater. Therefore, a part of the leakage current IL that flows in the sense element 32 increases, and hence, the current value of the sense current Ise that flows in the sense element 32 can be increased. By having the current value of the sense current Ise increased, the sense voltage Vse generated by the sense resistor 45 also increases. Therefore, the sense voltage detection part 43 can easily detect the sense voltage Vse even if the current value of the leakage current IL is extremely small, and can easily detect the very weak leakage current IL.

<Configuration of Switching Circuit 4>

Figure 2:
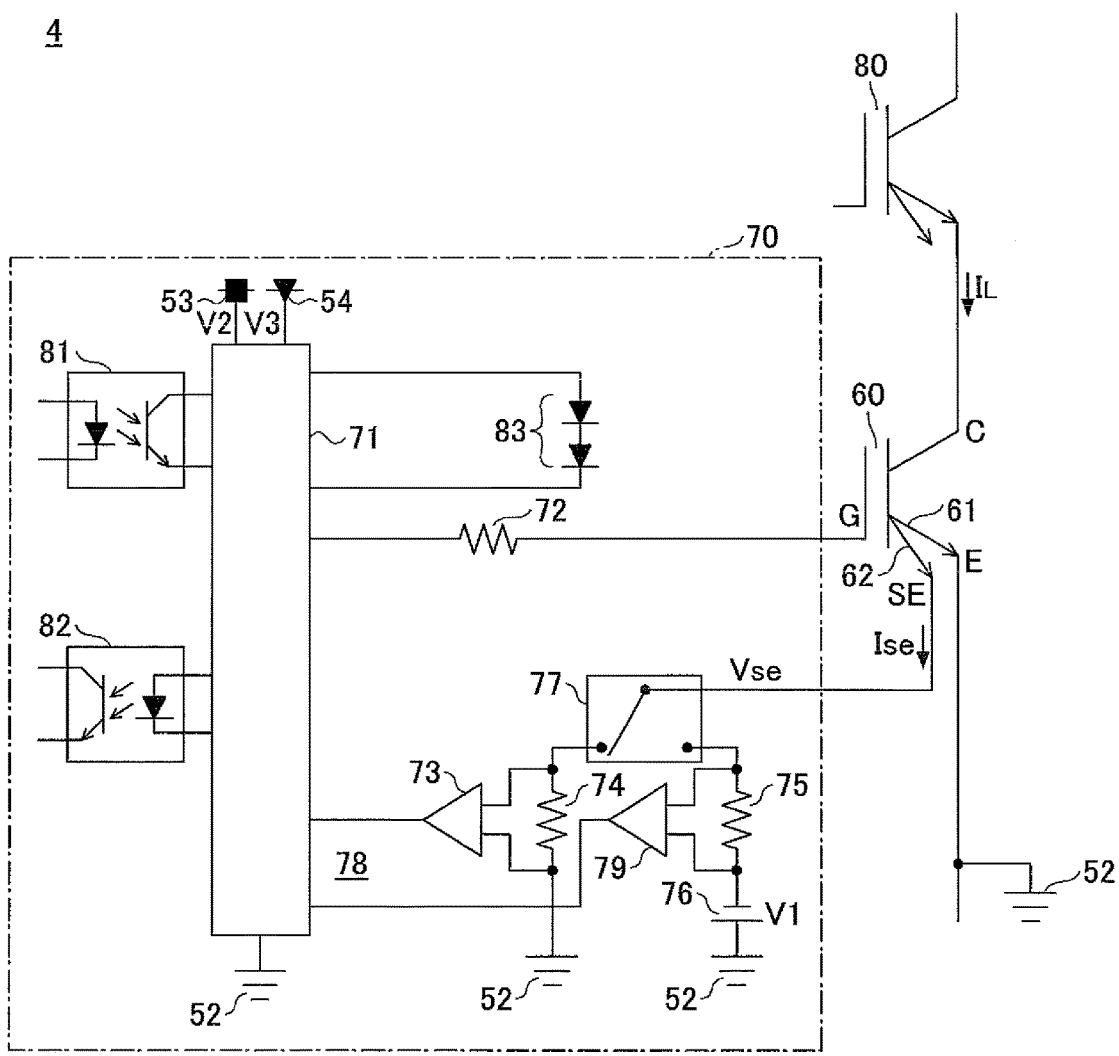
FIG. 2 is a configuration diagram that illustrates an example of a semiconductor control device.

FIG. 2 is a diagram that illustrates an example configuration of a semiconductor control device 4 that is different from the switching circuit in FIG. 1. Description is omitted or simplified for the same elements and functions as in the switching circuit 1 in FIG. 1. The switching circuit 4 includes a switching element 80 on the high side, a switching element 60 on the low side, and a control circuit 70 on the low side. Description and illustration of the control circuit on the high side is omitted because it has the same elements and functions as the control circuit 70 on the low side.

In FIG. 1, the sense current detection circuit 28 on the low side includes the sense voltage detection part 23 that is commonly used for the overcurrent detection and the leakage current detection, and the sense current detection circuit 48 on the high side includes the sense voltage detection part 43 that is commonly used for the overcurrent detection and the leakage current detection. By having the sense voltage detection part commonly used, the area of the sense voltage detection part can be reduced. On the other hand, in FIG. 2, a sense current detection circuit 78 includes separate sense voltage detection parts for overcurrent detection and for leakage current detection, namely, includes a sense voltage detection part 73 for overcurrent detection, and a sense voltage detection part 79 for leakage current detection. By separating the sense voltage detection parts, thresholds for detecting sense voltages can be separately set for overcurrent detection and leakage current detection.

The drive circuit 71 in FIG. 2 may include a temperature sensor 83 to detect the temperature of the switching element 60. When a temperature of a predetermined value or greater is detected by the temperature sensor 83, the drive circuit 71 controls, for example, the gate voltage Vge of the main element 61 and the gate voltage Vgse of the sense element 62, to a voltage value that turns off the main element 61 and the sense element 62. This makes it possible to prevent the main element 61 and the sense element 62 from overheating. The drive circuit in FIG. 1 may include such a function.

Also, in FIG. 2, the gate control signal supplied from the outside may be input into the drive circuit 71 via an isolator 81, and an output signal such as a leakage detection signal may be output from the drive circuit 71 via an isolator 82. As specific examples of the isolators 81 and 82, photocouplers may be considered. Signals that are input into or output from the drive circuit in FIG. 1 may be transferred via isolators in this way.

<Configuration of Switching Circuit 5>

Figure 3:
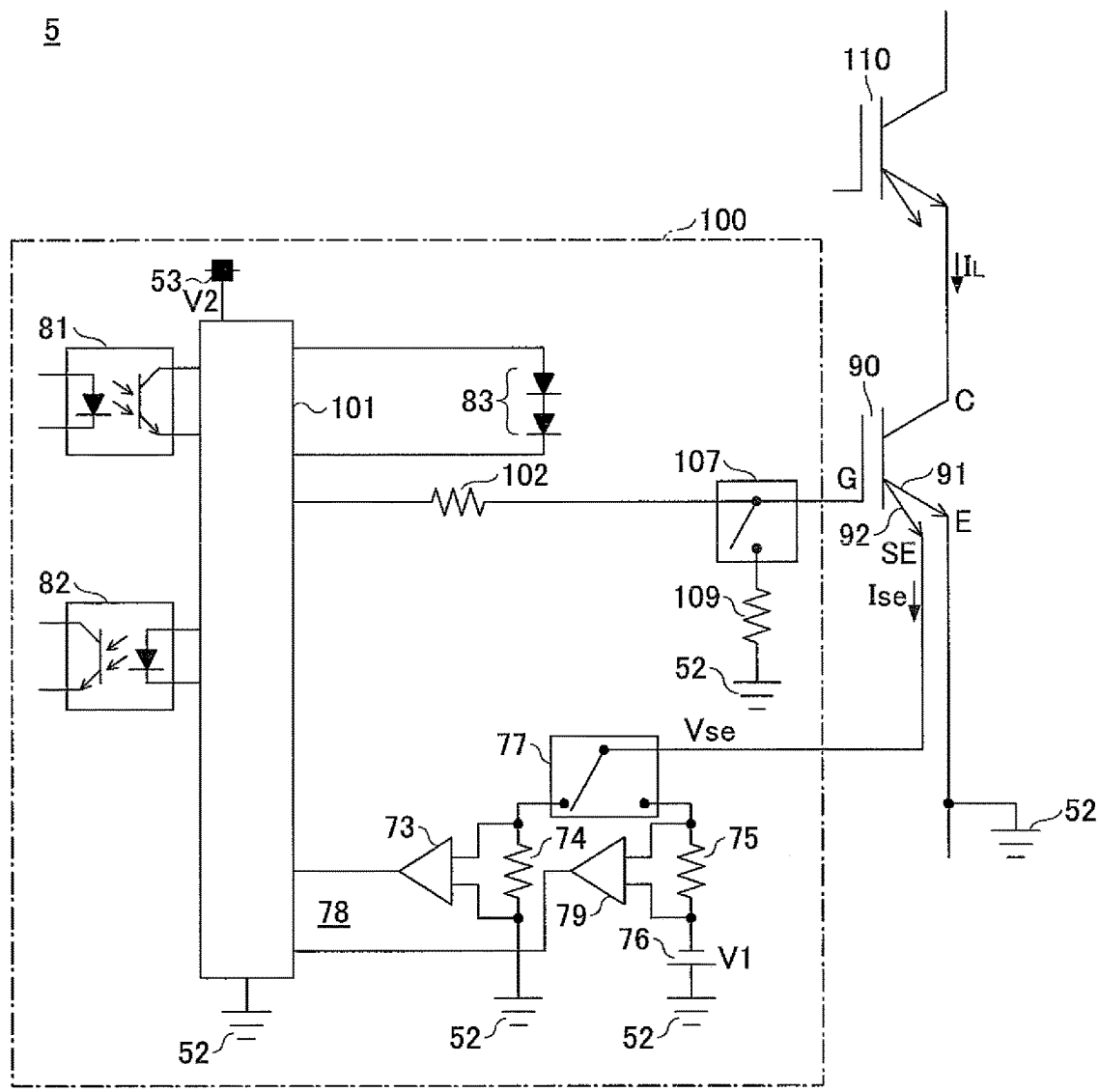
FIG. 3 is a configuration diagram that illustrates an example of a semiconductor control device.

FIG. 3 is a diagram that illustrates an example configuration of a semiconductor control device 5 that is different from the switching circuits in FIGS. 1 and 2. Description is omitted or simplified for the same elements and functions as in the switching circuits 1 and 4 in FIGS. 1 and 2. The switching circuit 5 includes a switching element 110 on the high side, a switching element 90 on the low side, and a control circuit 100 on the low side. Description and illustration of the control circuit on the high side is omitted because it has the same elements and functions as the control circuit 100 on the low side.

Compared to the configuration of the switching circuit 4 in FIG. 2, the switching circuit 5 is configured to have a switch 107 and a resistor 109 inserted between a connection point of the gate terminal G and a gate resistor 102, and the low power source potential part 52 connected with the emitter terminal E of the switching element 90. Also, the gate-driving power source 54 is omitted.

In a normal use state turning the switching element 90 on and off following the gate voltage (in a case where the leakage current IL is not measured that flows in the switching element 110), the switch 107 cuts off the gate terminal G from the resistor 109. On the other hand, in a case where the leakage current IL is to be measured that flows in the switching element 110, based on the sense current Ise that flows in a sense element 32, the switch 107 connects the gate terminal G with the resistor 109. Thus, a divided voltage of the power supply voltage V2 by the gate resistor 102 and the resistor 109 can be applied to the gate terminal G. Therefore, even without the gate-driving power source 54, when biasing the sense emitter electrode se of the sense element 92 by the negative voltage V1, the voltage biasing the gate electrodes of the main element 91 and the sense element 92 can be lowered.

The switch 107 switches whether to connect the gate terminal G with the resistor 109, for example, following a switching control signal that determines whether to measure the leakage current IL that flows in the switching element 110. Such a switching control signal may be commanded by, for example, the predetermined control unit (for example, the system control unit 126 in FIG. 4 as will be described later) or the drive circuit 101.

<Configuration of Control System 120>

Figure 4:
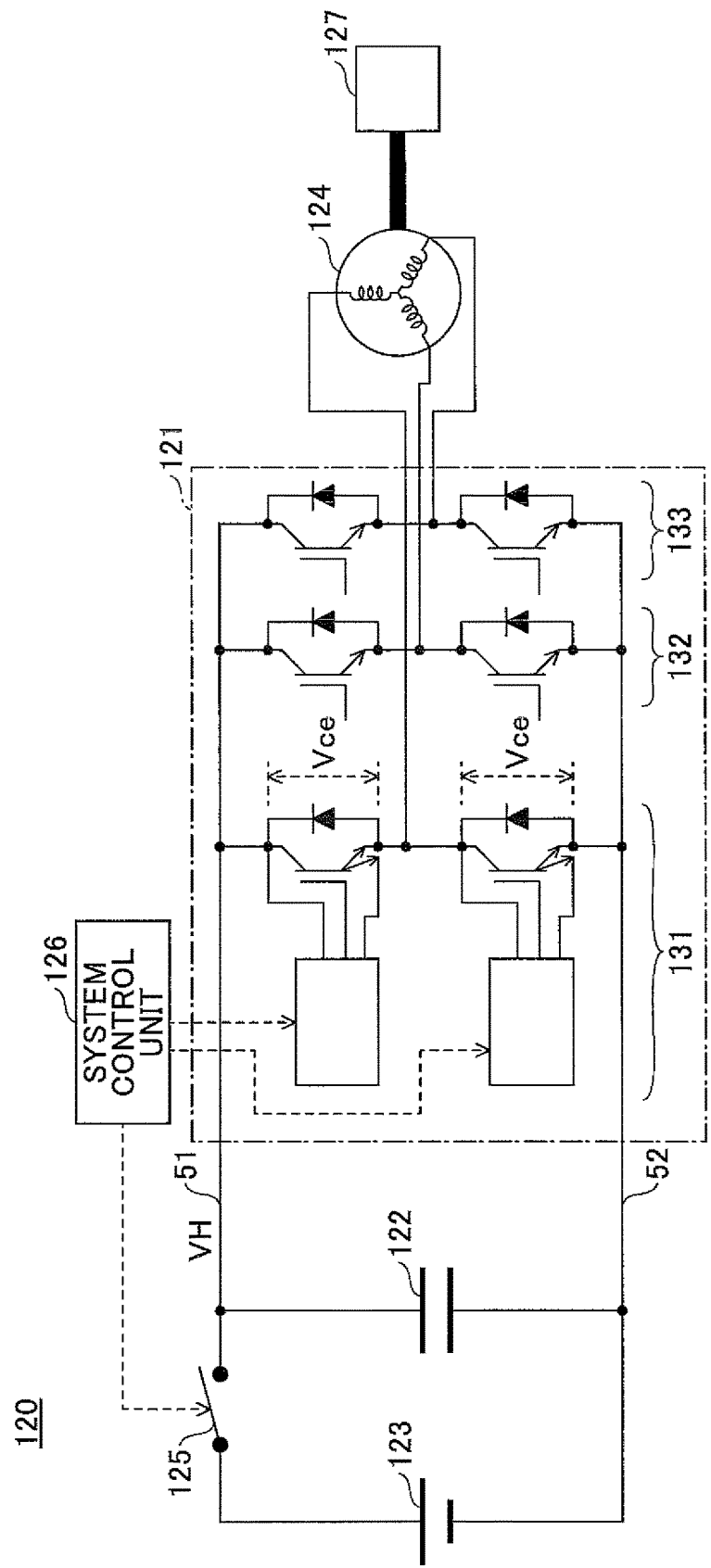
FIG. 4 is a configuration diagram that illustrates an example of a control system including an inverter having switching devices in parallel.

FIG. 4 is a diagram that illustrates a configuration of a control system 120 including an inverter having switching circuits 131, 132, and 133 in parallel. Each of the switching circuits 131, 132, and 133 has the same configuration as a switching circuit described above (for example, the switching circuit 1).

FIG. 4 illustrates a diode provided between the collector terminal C and the emitter terminal E of each switching element. The leakage current of the switching element may include the leakage current of the diode.

Note that this diode may be a diode that is additionally connected in parallel with the switching element, or may be a body diode that is a parasitic element formed between the collector electrode and the emitter electrode of the main element. It is also possible to use the diode part of a reverse conducting IGBT, as the diode.

The control system 120 is a system for a vehicle that includes the inverter 121, a capacitor 122, a battery 123, a generator 124, a cut-off relay 125, and the system control unit 126.

The capacitor 122 is a capacitor having a high-voltage resistance that is connected in parallel with the inverter 121, has one terminal connected with the high power source potential part 51, and the other terminal connected with the low power source potential part 52. The capacitor 122 smoothes the power supply voltage VH, which is the potential difference between the high power source potential part 51 and the low power source potential part 52. The capacitor 122 is connected in parallel with the battery 123 via the cut-off relay 125.

The battery 123 is a high-voltage storage battery having a greater capacitance than the capacitor 122, and generates DC power supply voltage VH.

The generator 124 generates three-phase AC power by the motive power of the engine 127 or the like, and charges the battery 123 or the capacitor 122 via the inverter 121.

The cut-off relay 125 is an example of a cutoff circuit that cuts off supplying the generated power from the generator 124 to the battery 123 via the inverter 121. By cutting off the path to charge the battery 123 by the cut-off relay 125, the generated power from the generator 124 is not supplied to the battery 123, but supplied to the capacitor 122 via the inverter 121.

The system control unit 126 is an example of a control unit that controls the cut-off relay 125 to make the voltage of the capacitor 122 (the power supply voltage VH) greater than or equal to a predetermined threshold, to cut off the charge path of the battery 123.

<Test Operation Flow of System Control Unit when Measuring Leakage Current>

Figure 5:
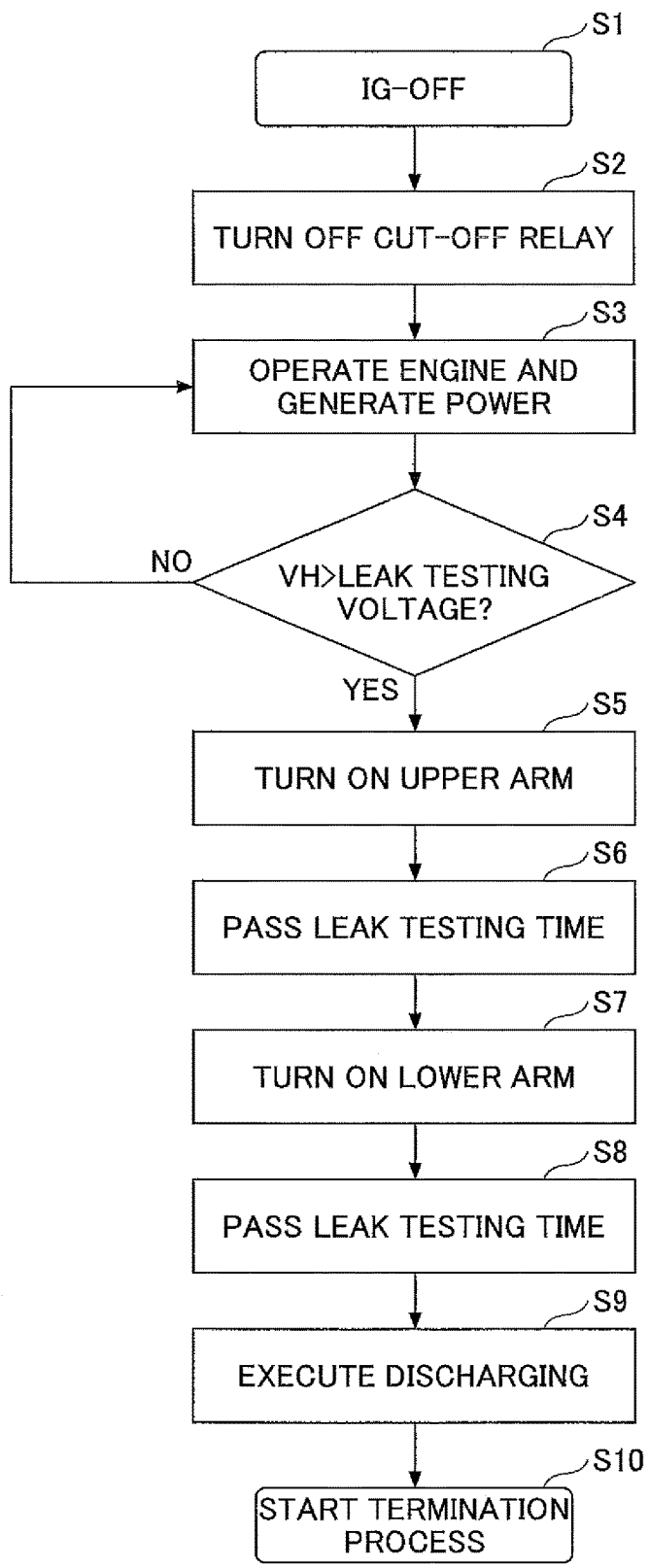
FIG. 5 is a flowchart that illustrates an example of control operations of a system control unit.

FIG. 5 is a flowchart that illustrates an example of control operations of the system control unit 126. According to FIG. 5, the system control unit 126 can turn on both the sense elements on the high side and the low side sequentially, and hence, can bias the sense electrodes of the both sense elements sequentially, by the negative voltage V1. Note that measurement of the leakage current on the high side may be done next to measurement of the leakage current on the low side, or vice versa. In the following, steps in FIG. 5 will be described with reference to the configurations in FIGS. 1 and 4.

When an off operation of the ignition switch is detected (Step S1), to raise the power supply voltage VH, the system control unit 126 cuts off the cut-off relay 125, to cut off the path for charging the battery 123 (Step S2). Then, by starting or maintaining the operation of the engine 127, the system control unit 126 makes the generator 124 generate power (Step S3).

The power generated by the generator 124 is not supplied to the battery 123 because the path for charging the battery 123 is cut off, but supplied to the capacitor 122 via the inverter 121. Since the charging path is cut off to the battery 123 having a greater capacitance than the capacitor 122, the power supply voltage VH tends to rise more easily, compared to a case where the charging path to the battery 123 is not cut off.

By having the power supply voltage VH rise, the voltages Vce between both terminals of the switching elements also rise. The voltage Vce between both terminals is a voltage between the collector terminal C and the emitter terminal E. By raising the voltage Vce between both terminals, it is possible to easily generate the leakage current that flows in the switching element.

The system control unit 126 does not start measuring the leakage current until the power supply voltage VH is detected to be greater than or equal to a predetermined the leakage testing voltage, but starts measuring the leakage current when the power supply voltage VH is detected to be greater than or equal to the predetermined the leakage testing voltage (Step S4). The leakage testing voltage is a threshold voltage set for determining whether to start measuring the leakage current.

Steps S5 and S6 are steps to detect the leakage current of the switching element on the low side, based on a sense current that flows in the sense element of the switching element on the high side.

For example, in the case of FIG. 1, at Step S5, to turn on the sense element 32 on the high side, the system control unit 126 outputs a gate control signal to command turning on the switching element 30 on the high side, to the drive circuit 41. On the other hand, at Step S5, the system control unit 126 outputs a gate control signal to command turning off the switching element 10 on the low side, to the drive circuit 21. This off command turns off the main element 11 and the sense element 12.

After a predetermined leakage testing time has passed since having output the gate control signal to command turning on the switching element 30 and turning off the switching element 10, the system control unit 126 executes operations of Steps S7 and S8. The leakage testing time is a threshold time set for securing time to detect the leakage current.

Steps S7 and S8 are steps to detect the leakage current of the switching element on the high side, based on a sense current that flows in the sense element of the switching element on the low side.

For example, in the case of FIG. 1, at Step S7, to turn on the sense element 12 on the low side, the system control unit 126 outputs a gate control signal to command turning on the switching element 10 on the low side, to the drive circuit 21. On the other hand, at Step S5, the system control unit 126 outputs a gate control signal to command turning off the switching element 30 on the high side, to the drive circuit 41. This off command turns off the main element 31 and the sense element 32.

After a predetermined leakage testing time has passed since outputting the gate control signal to command turning on the switching element 10 and turning off the switching element 30, the system control unit 126 executes operations of Steps S9 and S10. The leakage testing time is a threshold time set for securing time to detect the leakage current.

At Step S9, to lower the power supply voltage VH that has been temporarily raised, the system control unit 126 has the inverter 121 operate, to discharge the capacitor 122. Then, at Step S10, when the power supply voltage VH is detected to be lowered to a predetermined value or less, the system control unit 126 starts a halt process to halt the operation of the inverter 121.

<Test Operation Flow of Control Circuit when Measuring Leakage Current>

Figure 6:
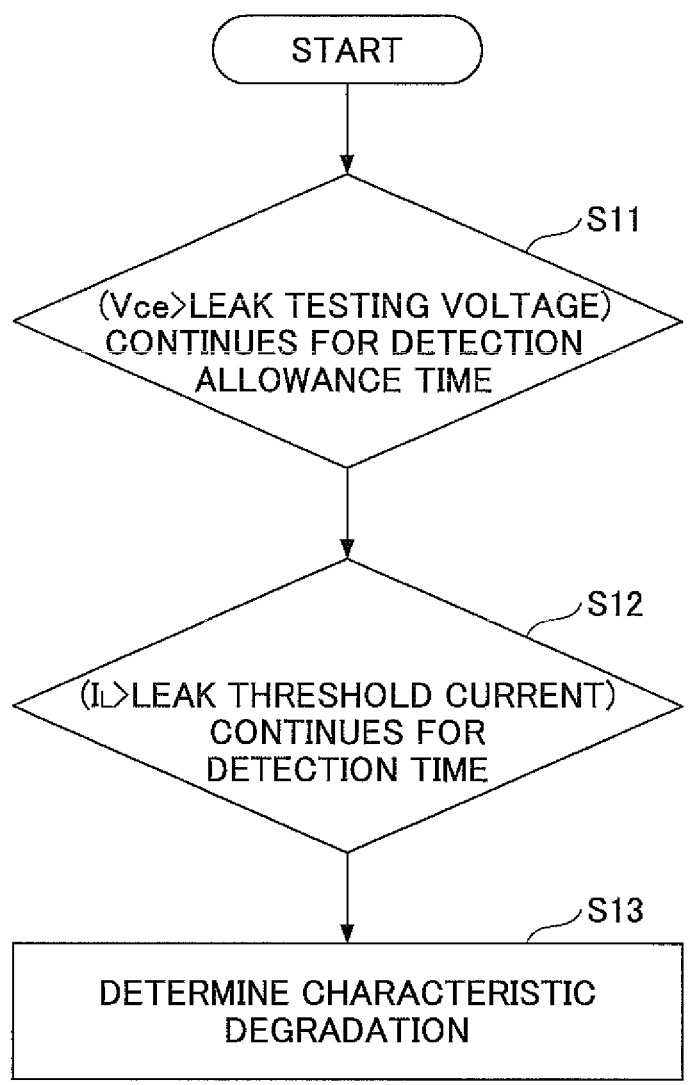
FIG. 6 is a flowchart that illustrates an example of control operations of a control circuit.

FIG. 6 is a flowchart that illustrates an example of control operations of a control circuit provided in each of the switching elements. The control logic of a control circuit in FIG. 6 is the same for the control circuit provided on the low side to detect the leakage current of the switching element on the high side, and for the control circuit provided on the high side to detect the leakage current of the switching element on the low side.

The gate control signal to command turning on the switching element that is driven by itself, is supplied to the drive circuits from the system control unit 126 at Steps S5 or S7 in FIG. 5 as described above. Also, a leakage testing voltage is a threshold voltage set for determining whether to start detecting the leakage current, and a permitted detection time is a threshold voltage set for determining whether to start detecting the leakage current.

When measuring the leakage current, the power supply voltage VH is raised by the control of the system control unit 126, and hence, the voltages Vce between both terminals of the main elements are raised. Therefore, each of the drive circuits can start detecting the leakage current if detecting at least that a voltage of the voltage Vce between both terminals of the main element driven by itself, is greater than or equal to a predetermined threshold voltage, even without being commanded to detect the leakage current by the system control unit 126.

For example, in the case of FIG. 1, after having started detecting the leakage current, the drive circuit 21 on the low side lowers the voltage to bias both the gate electrodes g of the main element 11 and the sense element 12, from the power supply voltage V2 to the power supply voltage V3. In addition, after having started detecting the leakage current, the drive circuit 21 controls the switch 27 to bias the sense emitter electrode se of the sense element 12 by the negative voltage V1 to turn on the sense element 12. Being controlled by the drive circuit 21, the switch 27 switches the connection destination of the sense emitter electrode se of the sense element 12, to the bias power source 26. Therefore, the drive circuit 21 can detect the leakage current of the switching element 30, based on the sense current Ise that flows in the sense element 12.

Similarly, after having started detecting the leakage current, the drive circuit 41 on the high side lowers the voltage to bias both the gate electrodes g of the main element 31 and the sense element 32, from the power supply voltage V2 to the power supply voltage V3. In addition, after having started detecting the leakage current, the drive circuit 41 controls the switch 47 to bias the sense emitter electrode se of the sense element 32 by the negative voltage V1 to turn on the sense element 32. Being controlled by the drive circuit 41, the switch 47 switches the connection destination of the sense emitter electrode se of the sense element 32, to the bias power source 46. Therefore, the drive circuit 41 can detect the leakage current of the switching element 10, based on the sense current Ise that flows in the sense element 32.

If a predetermined condition is satisfied, the drive circuit of each of the control circuits starts detecting the leakage current of the other switching element that is connected in series with the switching element driven by itself (Step S11). For example, if the control circuit receives a gate control signal to command turning on the switching element driven by itself, and a state continues for a predetermined permitted detection time during which the voltage Vce between both terminals of the main element driven by itself is greater than a predetermined leakage testing voltage, the control circuit starts detecting the leakage current.

Also, for example, in the case of FIG. 2, after having started detecting the leakage current, the drive circuit 71 lowers the voltage to bias both the gate electrodes g of the main element 61 and the sense element 62, from the power supply voltage V2 to the power supply voltage V3. In addition, after having started detecting the leakage current, the drive circuit 71 controls the switch 77 to bias the sense emitter electrode se of the sense element 62 by the negative voltage V1 to turn on the sense element 62. Being controlled by the drive circuit 71, the switch 77 switches the connection destination of the sense emitter electrode se of the sense element 62, to the bias power source 76. Therefore, the drive circuit 71 can detect the leakage current of the switching element 80, based on the sense current Ise that flows in the sense element 62.

Also, for example, in the case of FIG. 3, the drive circuit 101 controls the switch 107 so that gate electrodes g of both the main element 91 and the sense element 92 are connected with the low power source potential part 52 via the resistor 109. Being controlled by the drive circuit 101, the switch 107 can supply a voltage obtained by dividing the power supply voltage V2 by the gate resistor 102 and the resistor 109, to the gate electrodes g of both the main element 91 and the sense element 92. In addition, after having started detecting the leakage current, the drive circuit 101 controls the switch 77 to bias the sense emitter electrode se of the sense element 92 by the negative voltage V1 to turn on the sense element 92. Being controlled by the drive circuit 101, the switch 77 switches the connection destination of the sense emitter electrode se of the sense element 92, to the bias power source 76. Therefore, the drive circuit 101 can detect the leakage current of the switching element 110, based on the sense current Ise that flows in the sense element 92.

Next, at Step S12, if a state continues for a predetermined detection time during which the detected value of the leakage current is greater than a predetermined threshold current, the drive circuit of each of the control circuits determines that a leakage current greater than or equal to a predetermined current value is detected. For example, if output time of the sense current detection signal that is output from the sense voltage detection part, continues for the predetermined detection time, the drive circuit determines that a leakage current greater than or equal to the predetermined current value is detected. For example, in the case of FIG. 1, if output time of the sense current detection signal that is output from the sense voltage detection part 23, continues for the predetermined detection time, the drive circuit 21 determines that a leakage current greater than or equal to the predetermined current value is detected in the switching element 30.

If determining that a leakage current greater than or equal to the predetermined current value is detected, the drive circuit outputs a leakage detection signal to the system control unit 126, to indicate that characteristic degradation has been confirmed for the other switching element that is connected in series with the switching element driven by itself.

The semiconductor control device, the switching circuit, the inverter, and the control system have been described with the embodiments as above. Note that the present invention is not limited to the above embodiments. Various modifications and improvements can be made within the scope of the present invention, by combining and/or replacing a part of or all of the embodiments with the others.

For example, the system control unit 126 may control a switch (for example, the switch 27 or the switch 47 in the case of FIG. 1) so that the negative voltage to turn on the sense element biases the sense emitter electrode of the sense element.

Also, for example, the semiconductor control device is not limited to be used in the inverter, but may be used in a DC-DC converter, a power source circuit, a booster circuit, a step-down circuit, or the like.

Also, for example, a switching element is not limited to be an IGBT, but may be an N-channel MOSFET, or may be a P-channel MOSFET.

The present international application is based on Japanese Priority Application No. 2013-212167, filed on Oct. 9, 2013, the entire contents of which are hereby incorporated by reference.

DESCRIPTION OF REFERENCE SYMBOLS 1, 4, 5, 131, 132, 133 switching circuit
2, 3 semiconductor control device
10, 30, 60, 80, 90, 110 switching element
11, 31, 61, 91 main element
12, 32, 62, 92 sense element
20, 40, 70, 100 control circuit
21, 41, 71, 101 drive circuit
22, 42, 72, 102 gate resistor 23, 43, 73, 79 sense voltage detection part
24, 44, 74 sense resistor (resistor for overcurrent detection)
25, 45, 75 sense resistor (resistor for leakage current detection)
26, 46, 76 bias power source
27, 47, 77, 107 switch
28, 48, 78 sense current detection circuit
50 intermediate node part
51, 52 power source potential part
53, 54, 55, 56 power source for driving gate
81, 82 isolator
83 temperature sensor
109 resistor
120 control system
121 inverter
122 capacitor
123 battery
124 generator
125 cut off relay
126 system control unit
127 engine

The invention claimed is:

1. A semiconductor control device, comprising:
a switching element including a main element, and a sense element connected in parallel with the main element; and
a control circuit configured to bias a sense electrode of the sense element by a negative voltage, and to detect a leakage current of another switching element connected in series with the main element.

2. The semiconductor control device as claimed in claim 1, wherein the control circuit biases the sense electrode by the negative voltage, to make a voltage between a gate electrode and the sense electrode of the sense element become higher than a voltage between a gate electrode of the main element and a main electrode of the main element.

3. The semiconductor control device as claimed in claim 1, wherein the control circuit biases the sense electrode by the negative voltage, to make a greater current flow in the sense element than in the main element.

4. The semiconductor control device as claimed in claim 1, wherein the control circuit biases the sense electrode by the negative voltage, so as to turn on the sense element, without turning on the main element.

5. The semiconductor control device as claimed in claim 1, wherein the control circuit lowers a voltage to bias the gate electrodes of the main element and the sense element, when biasing the sense electrode by the negative voltage.

6. The semiconductor control device as claimed in claim 1, wherein the control circuit detects the leakage current when the voltage between both terminals of the main element is detected to be greater than or equal to a predetermined value.

7. The semiconductor control device as claimed in claim 1, wherein the control circuit includes a resistor to be used for detecting the leakage current, and biases the sense electrode by the negative voltage via the resistor.

8. The semiconductor control device as claimed in claim 7, wherein the control circuit include a first resistor configured to be used for detecting the leakage current,
a second resistor configured to be used for detecting an overcurrent of the main element, and
a switching circuit configured to switch a connection destination of the sense electrode to the first resistor or the second resistor.

9. The semiconductor control device as claimed in claim 8, wherein the first resistor has a greater resistance value than that of the second resistor.

10. A switching device, comprising:
the semiconductor control devices as claimed in claim 1, provided on a high side and on a low side, respectively.

11. The switching device as claimed in claim 10, wherein the respective sense electrodes of the sense elements on the high side and on the low side are biased sequentially by the negative voltage.

12. An inverter, comprising:
a plurality of the switching devices as claimed in claim 10, provided in parallel.

13. A control system, comprising:
the inverter as claimed in claim 12;
a capacitor configured to be connected in parallel with the inverter;
a battery configured to have a greater capacitance than the capacitor;
a generator configured to charge the capacitor via the inverter; and
a cutoff circuit configured to cut off supplying power from the generator to the battery via the inverter.

14. The control system as claimed in claim 13, further comprising:
a control unit configured to control the cutoff circuit so as to make a voltage of the capacitor be greater than or equal to a predetermined threshold.

15. The control system as claimed in claim 14, wherein the control unit turns on the sense elements on the high side and the low side sequentially when the voltage of the capacitor is detected to be greater than or equal to the threshold.

* * * * *